United States Patent
Suzuki et al.

(10) Patent No.: US 6,207,082 B1
(45) Date of Patent: *Mar. 27, 2001

(54) LAYER-STRUCTURED OXIDE AND PROCESS OF PRODUCING THE SAME

(75) Inventors: Masayuki Suzuki; Naomi Nagasawa; Akio Machida; Takaaki Ami, all of Kanagawa (JP)

(73) Assignee: Sony Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/848,613

(22) Filed: Apr. 29, 1997

(30) Foreign Application Priority Data

Jul. 24, 1996 (JP) .................................................. 8-213120
Sep. 5, 1996 (JP) .................................................. 8-255470

(51) Int. Cl.[7] ...................................................... H01B 1/02
(52) U.S. Cl. ..................................................... 252/519.13
(58) Field of Search ........................ 257/295; 361/321.4, 361/320, 321.1, 321.2, 321.3, 321.5; 117/92, 84; 252/519.13

(56) References Cited

U.S. PATENT DOCUMENTS 3,997,457 * 12/1976 Takahashi et al. ................. 252/63.5
4,400,445 * 8/1983 Berkstresser et al. ............... 252/364
5,426,075 * 6/1995 Perino et al. ....................... 437/235
5,439,845 * 8/1995 Watanabe et al. ................... 437/130
5,519,234 * 5/1996 Paz De Araujo et al. .......... 257/295
5,519,235 * 5/1996 Ramesh ............................... 257/295
5,519,566 * 5/1996 Perino et al. ..................... 361/321.4
5,955,754 * 9/1999 Azuma et al. ....................... 257/295

* cited by examiner

Primary Examiner—Benjamin L. Utech
Assistant Examiner—Matthew Andersen
(74) Attorney, Agent, or Firm—Sonnenschein, Nath & Rosenthal (57) ABSTRACT

A layer-structured oxide exhibiting a paraelectric characteristic and a layer-structured oxide having a preferable remanent polarization, and a process of producing the same. A layer-structured oxide containing Bi, a first component Me, a second component R, and O is produced by heating raw materials at a high temperature of about 1400° C. for several ten minutes by a self-flux method using $Bi_2O_3$ as a flux. The first component Me is composed of at least one kind selected from a group consisting of Sr, Pb, Ba, and Ca, and the second component R is composed of at least one kind selected from a group consisting of Nb and Ta. The composition formula of the oxide is expressed by $Bi_{2-a}Me_{1+b}R_2O_{9+c}$ where a, b, and c are values in ranges of $0<a<2$, $0<b\leq0.4$, and $-0.3\leq c\leq1.4$. The layer-structured oxide exhibits a paraelectric characteristic or a ferroelectric characteristic at a composition in a specific range out of the stoichiometric composition.

6 Claims, 6 Drawing Sheets

(a) X-RAY DIFFRACTION PATTERN IN EXAMPLE 1
(b) RIETVELD SIMULATION PATTERN

(a) X-RAY DIFFRACTION PATTERN IN EXAMPLE 1
(b) RIETVELD SIMULATION PATTERN

(a) X-RAY DIFFRACTION PATTERN IN EXAMPLE 2
(b) RIETVELD SIMULATION PATTERN

LAYER-STRUCTURED OXIDE AND PROCESS OF PRODUCING THE SAME

BACKGROUND OF THE INVENTION

The present invention relates to layer-structured oxides, called an aurivillius crystal group, containing bismuth, strontium, tantalum, and oxygen, and a process of producing the oxides.

Recently, non-volatile memories made of ferroelectric thin films have been actively developed, and along with such a tendency, bismuth-strontium-tantalate, $Bi_2SrTa_2O_9$ (hereinafter, referred to as BiSTa) having an excellent fatigue characteristic has become a focus of attention as a ferroelectric material constituting ferroelectric random access memories (FeRAMs) [see C. A-Paz de Araujo, J. D. Cuchiaro, L. D. McMillan, M. C. Scott and J. F. Scott, Nature, 374 (1995) 627; K. Amanuma, T. Hase and Y. Miyasaka, Appl. Phys. Lett., 66 (1995) 221; and S. B. Desu and D. P. Vijay, Master, Sci. and Eng., B32 (1995) 75].

With respect to BiSTa, lately, it has been reported that a thin film of BiSTa for FeRAMs was satisfactorily produced [see T. Ami, K. Hironaka, C. Isobe, N. Nagel, M. Sugiyama, Y. Ikeda, K. Watanabe, A. Machida, K. Miura and M. Tanaka, Mater. Res. Soc. Symp. Proc., 415 (1996) 195; and T. Li, Y. Zhu, S. B. Desu, C-H. Peng, M. Nagata, Appl. Phys. Lett., 68 (1996) 616].

Incidentally, BiSTa belongs to a so-called aurivillius crystal group. Various studies have been made of the aurivillius crystal group [see G. A. Smolenskii, V. A. Isupov and A. I. Agranovskaya, Soviet Phys. Solid State, 3 (1961) 651; E. C. Subbarao, Phys. Rev. 122 (1961) 804; and R. E. Newnham, R. W. Wolfe and J. F. Dorrian, Mater. Res. Bull., 6 (1971) 1029]. In addition, the aurivillius crystal group has a composition formula expressed by $[Bi_2O_2]^{2+}[Me_{m-1}R_mO_{3m+1}]^{2-}$ where m is an integer of 2 or more, Me is at least one kind selected from a group consisting of sodium (Na), potassium (K), calcium (Ca), barium (Ba), strontium (Sr), lead (Pb), and bismuth (Bi), and R is at least one kind selected from a group consisting of iron (Fe), niobium (Nb), tantalum (Ta), and tungsten (W).

With respect to production of single crystals of the aurivillius crystal group, however, there have been reported only a few studies, for example, the crystallographic study of a single crystal of BiSTa by Newnham or Rae [see R. E. Newnham, R. W. Wolfe, R. S. Horsey, F. A. Diaz-Colon and M. I. Kay, Mater. Res. Bull., 8 (1973) 1183; and A. D. Rae, J. G. Thompson and R. L. Withers, Acta. Cryst., B48 (1992) 418], and the study of a single crystal of $Bi_4Ti_3O_{12}$ by Dorrian or Bruton [see J. F. Dorrian, R. E. Newnham, D. K. Smith and M. I. Kay, Ferroelectrics, 3 (1971) 17; T. M. Bruton, Ferroelectrics, 7 (1974) 259].

Of the above two papers on BiSTa, the Newnham's paper did not certainly describe the composition ratio of starting materials, and the Rae's paper described the use of starting materials mixed at a constant ratio but it reported only a plate-like single crystal in a two-phase mixture state. Also, in these two papers, the analysis for characteristics of the single crystal obtained was little performed. Namely, physical properties of the aurivillius crystal group have been little known, and in recent years, there has been only barely reported a relationship between the anisotrophy and the layered structure for a single crystal of $Bi_4BaTi_4O_{15}$ equivalent to the composition of the aurivillius crystal group where m=4 [see S-K. Kim, M. Miyayama and H. Yanagida, J. Ceram, Soc. Japan, 102 (1994) 722].

In these circumstances, with regard to a relationship between the composition of BiSTa and electric characteristics, it has been considered that BiSTA can exhibit a desirable remanent polarization at its stoichiometric composition [see H. Watanabe, T. Mihara, H. Yoshimori and Carios. A. Paz de Araujo, Jpn. J. Appl. Phys. 34 (1995) 5240]. Such a relationship, however, has not been fully studied, and therefore, there is a possibility that BiSTa exhibits a more desirable remanent polarization at a composition out of the stoichiometric composition.

On the other hand, the aurivillius crystal group have been considered to exhibit a ferroelectric characteristic at room temperature on the basis of the knowledge regarding the temperature dependence on a dielectric constant. However, with respect to materials belonging to the aurivillius crystal group, the number of those exhibiting ferroelectric hysteresis curves is never large, and there possibly exist those exhibiting a paraelectric characteristic. And, if there exist the materials exhibiting a paraelectric characteristic, they can extensively used for new applications different from the known ones.

The new applications may include assistants used for forming capacitors and capacitor materials for DRAMs (Dynamic Random Access Memories). In general, a capacitor is made of a ferroelectric material composed of an oxide having a perovskite structure expressed by $ABO_3$ (for example, PZT which is a solid solution of $PbTiO_3$ and $PbZrO_3$, and $BaTiO_3$) added with a suitable paraelectric material as an assistant. In most cases, a paraelectric material composed of an oxide expressed by $ABO_3$ has been used as such an assistant, and of course, any examination has been not made to use a material belonging to the aurivillius crystal group as the assistant. However, with respect to materials belonging to the aurivillius crystal group, if there can be found those exhibiting a paraelectric characteristic, it becomes possible to produce a capacitor capable of further suppressing reduction in dielectric constant and further reducing the temperature dependency on the dielectric constant, using the material exhibiting a paraelectric characteristic as a new assistant.

SUMMARY OF THE INVENTION

An object of the present invention is to provide a layer-structured oxide as a new paraelectric material which is usable as an assistant for forming a capacitor and as a capacitor material, and a process of producing the same.

Another object of the present invention is to provide a layer-structured oxide exhibiting a desired remanent polarization, and a process of producing the same.

To achieve the above objects, according to a first aspect of the present invention, there is provided a layer-structured oxide containing bismuth (Bi), strontium (Sr), tantalum (Ta), and oxygen (O), wherein a composition formula of the oxide is expressed by $Bi_{1.92}Sr_{1.10}Ta_{2.00}O_9$.

Since the above oxide has a composition out of the stoichiometric composition, in which the content of bismuth is slightly deficient and the content of strontium is slightly excessive as compared with those in the stoichiometric composition, it exhibits a paraelectric characteristic or a ferroelectric characteristic at the composition out of the stoichiometric composition.

According to a second aspect of the present invention, there is provided a layer-structured oxide containing bismuth (Bi), strontium (Sr), tantalum (Ta), and oxygen (O), wherein a composition formula of the oxide is expressed by $Bi_{2-a}Sr_{1+b}Ta_2O_{9+c}$ where a, b, and c are values in ranges of $0<a\leq0.2$, $0<b\leq0.3$, and $-0.3\leq c\leq0.3$.

Since the above oxide has a composition in a range out of the stoichiometric composition, in which the content of bismuth is slightly deficient in a specific range and the content of strontium is slightly excessive in a specific range as compared with those in the stoichiometric composition, it exhibits a paraelectric characteristic or a ferroelectric characteristic at the composition in the range out of the stoichiometric composition.

According to a third aspect of the present invention, there is provided a layer-structured oxide containing bismuth (Bi), strontium (Sr), tantalum (Ta), and oxygen (O), wherein a composition formula of the oxide is expressed by $Bi_{2-a}Sr_{1+b}Ta_2O_{9+c}$ where a, b, and c are values in ranges of $0<a<2$, $0<b\leq0.4$, and $-0.3\leq c\leq1.4$.

Since the above oxide has a composition in a range out of the stoichiometric composition, in which the content of bismuth is deficient in a specific range and the content of strontium is excessive in a specific range as compared with those in the stoichiometric composition, it exhibits a paraelectric characteristic or a ferroelectric characteristic at the composition in the range out of the stoichiometric composition.

According to a fourth aspect of the present invention, there is provided a layer-structured oxide containing bismuth (Bi); a first component composed of at least one kind selected from a group consisting of strontium (Sr), lead (Pb), barium (Ba), and calcium (Ca); a second component composed of at least one kind selected from a group consisting of niobium (Nb) and tantalum (Ta); and oxygen (O), wherein a composition formula of the oxide is expressed by $Bi_{2-a}Me_{1+b}R_2O_{9+c}$ where Me is the first component, R is the second component, and a, b, and c are values in ranges of $0<a<2$, $0<b\leq0.4$, and $-0.3\leq c\leq1.4$.

Since the above oxide has a composition in a range out of the stoichiometric composition, in which the content of bismuth is deficient in a specific range and the content of the first component is excessive in a specific range as compared with those in the stoichiometric composition, it exhibits a paraelectric characteristic or a ferroelectric characteristic at the composition in the range out of the stoichiometric composition.

Each of the above oxides is preferably produced by a self-flux method using bismuth oxide as a flux.

DETAILED DESCRIPTION OF THE PREFERRED EMBODIMENTS

Hereinafter, one preferred embodiment of the present invention will be described with reference to the drawings.

A layer-structured oxide in this embodiment contains bismuth, a first component, a second component, and oxygen, wherein the first component is composed of at least one kind selected from a group consisting of strontium, lead, barium, and calcium, and the second component is composed of at least one kind selected from a group consisting of niobium and tantalum. The composition formula of the layer-structured oxide is expressed by $Bi_{2-a}Me_{1+b}R_2O_{9+c}$ where Me is the first component, R is the second component, and a, b, and c are values in ranges of $0<a<2$, $0<b\leq0.4$, and $-0.3\leq c\leq1.4$. preferably, in ranges of $0<a\leq0.2$, $0<b\leq0.3$, and $-0.3\leq c\leq0.3$. This layer-structured oxide has a composition in a range out of the stoichiometric composition, in which bismuth is deficient and the first component is excessive as compared with those in the stoichiometric composition. In the above composition formula of the layer-structured oxide, preferably, a, b, and c are values in ranges of $0<a\leq0.2$, $0<b\leq0.3$, and $-0.3\leq c\leq0.3$. In this layer-structured oxide, bismuth is slightly deficient and the first component is slightly excessive as compared with those in the stoichiometric composition.

Figure 1:
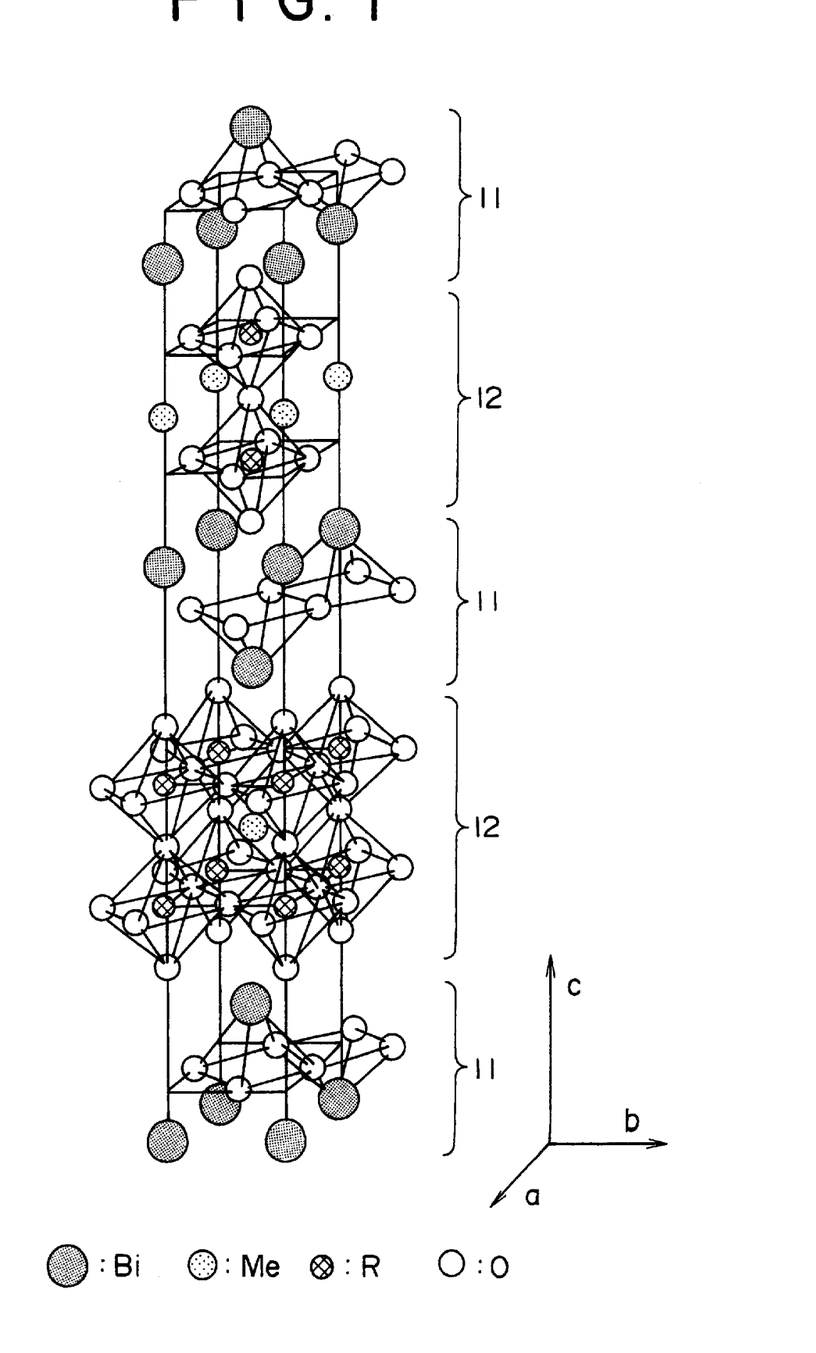
FIG. 1 is a schematic view showing a crystal structure of a layer-structured oxide according to one embodiment of the present invention.

The layer-structured oxide has a crystal structure shown in FIG. 1, in which layers 11 equivalent to $[Bi_2O_2]^{2+}$ and layers 12 equivalent to $[MeR_2O_7]^{2-}$ are alternately stacked. In addition, FIG. 1 shows a crystal structure of a perfect crystal having a stoichiometric composition.

The layer-structured oxides includes those exhibiting a paraelectric characteristic within a c-face and those exhibiting a ferroelectric characteristic within a c-face. In this layer-structured oxide, the deficiency of bismuth from the content of bismuth in the stoichiometric composition may be compensated for the increment of the first component.

The layer-structured oxide exhibiting a ferroelectric characteristic has a desirable remanent polarization. Such an electric field-polarization characteristic may be influenced by the crystal structure of the oxide in which part of bismuth is replaced with the first component.

In addition, as can be seen from the crystal structure shown in FIG. 1, the layer-structured oxide exhibits an anisotropic c-face cleavage like a bismuth layer-structured superconductor [see H. Maeda, Y. Tanaka, M. Fukutomi and T. Asano, Jpn. J. Appl. Phys., 27 (1988) L209; and K. Hiraga, M. Hirabayashi, M. Kikuchi and Y. Syono, Jpn. J. Appl. Phys., 27 (1988) L573].

The layer-structured oxide having the above configuration can be produced by a self-flux method using bismuth oxide ($Bi_2O_3$) as a flux. The self-flux method is one of single crystal growth methods, in which a material constituting part of a composition of a crystal to be obtained is used as a flux [see Y. Hidaka, Y. Enomoto, M. Suzuki, M. Oda and T. Murakami, J. Cryst. Growth, 85 (1987) 581; and Y. Hidaka, M. Oda, M. Suzuki, Y. Maeda, Y. Enomoto and T. Murakami, Jpn. J. Appl. Phys., 27 (1988) L538].

In the self-flux method, raw materials are heated at a high temperature of about 1400° C. for several ten minutes for growth of crystals. Here, when the holding time at a high temperature is longer, an impurity phase $SrTa_4O_{11}$ (JCPDS No. 16-708) is produced, while when it is shorter, an impurity phase $\beta-Bi_2O_3$ (JCPDS No. 27-50) or $\alpha-Bi_2O_3$ (JCPDS No. 27-53) is produced. If the impurity phase $SrTa_4O_{11}$ is produced, the crystal is colored into white, while when the impurity phase $\beta-Bi_2O_3$ or $\alpha-Bi_2O_3$ is produced, the crystal is colored into thin yellow. In addition, the pure crystal of the layer-structured oxide in this embodiment is colorless and transparent.

Since the layer-structured oxide in this embodiment has a composition in which the content of bismuth is deficient in a specified range and the content of the first component is excessive in a specific range as compared with those in the stoichiometric composition, it can exhibit a paraelectric characteristic. Such a new paraelectric oxide is usable as an assistant for forming a capacitor and as a capacitor material for DRAMs.

Further, since the layer-structured oxide in this embodiment has a composition in which the content of bismuth is deficient in a specified range and the content of the first component is excessive in a specific range as compared with those in the stoichiometric composition, it can exhibit a ferroelectric characteristic having a desirable remanent polarization. A FeRAM formed using such a ferroelectric oxide can be increased in fatigue characteristic and improved in quality.

According to the process of producing the layer-structured oxide in this embodiment, since the layer-structured oxide is produced by a self-flux method using bismuth oxide as a flux, the process requires heating at a high temperature of about 1400° C., differently from a double stage sintering process proposed by Subbarao [see E. C. Subbarao, Phys. Solids. 23 (1962) 665]; however, it allows thin film pieces of single crystals containing no impurity to be produced on a large scale.

The present invention will be more clearly understood with reference to the following examples:

It is to be noted that in the following examples, description will be made of the case of producing a layer-structured oxide containing bismuth, strontium, tantalum, and oxygen by a self-flux method.

EXAMPLE 1

Raw materials, bismuth oxide ($Bi_2O_3$), strontium oxide ($SrO_3$), and tantalum oxide ($Ta_2O_5$) (each being special grade reagents produced by Koujundo Kagakukenkyusho) were mixed at a mole percentage of $Bi_2O_3:SrO_3:Ta_2O_5=$ 79.0:10.5:10.5. Namely, bismuth oxide was used as a flux.

Figure 2:
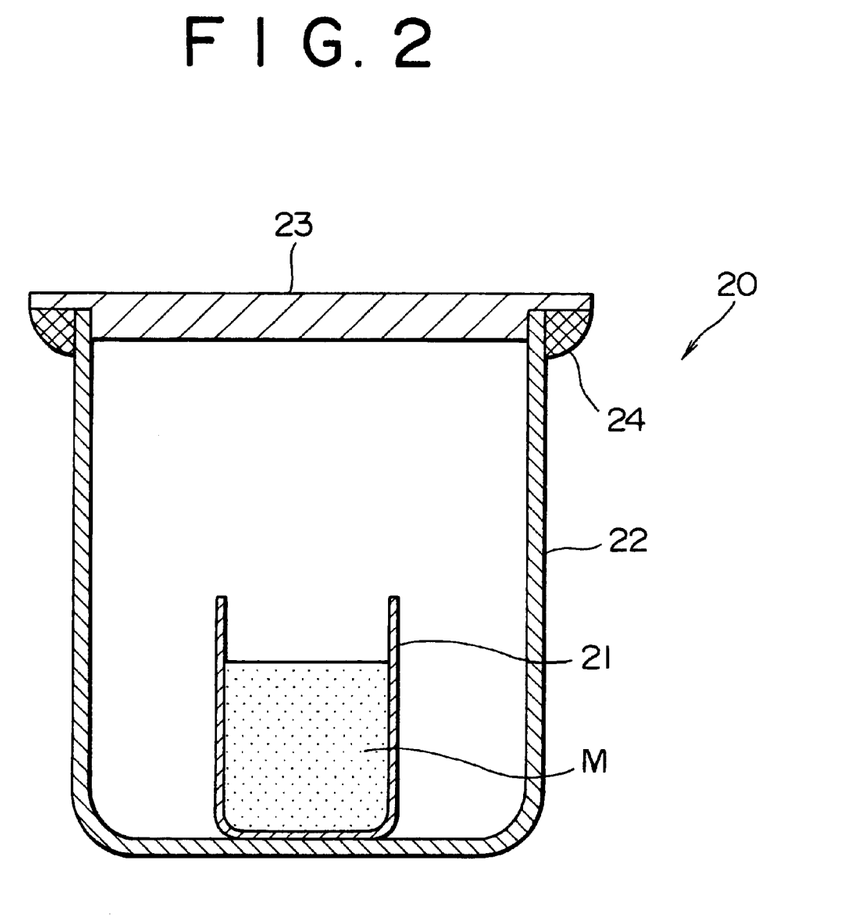
FIG. 2 is a configuration view showing a double structure crucible used for producing layer-structured oxides in Examples 1 and 2 of the present invention.

Next, a double structure crucible 20 shown in FIG. 2 was prepared for controlling evaporation of a bismuth compound. The raw materials M thus mixed were put in an inner platinum crucible 21, which was then put in an outer alumina crucible 22. After that, an alumina lid 23 was put on the alumina crucible 22, followed by fixing using a sealing ceramic 24. This sealing is effective to simply suppress the evaporation of a bismuth compound in a furnace.

The sealed double structure crucible 20 was inserted in a furnace, and heated up to a temperature of 1400° C. at a temperature rise rate of 100° C./hr. The crucible 20 was held at 1400° C. for 2 hr, being slowly cooled to 1200° C. at a temperature drop rate of 5° C./hr, and cooled in the furnace to room temperature. Thus, there were obtained transparent flakes of single crystals in the platinum crucible 21. The largest flake had a size of 4 mm×3 mm×5 μm.

Each single crystal thus obtained was then subjected to (1) identification analysis by X-ray diffraction; (2) observation of a microstructure by a SEM (Scanning Electron Microscope); (3) observation of a surface morphology by an AFM (Atomic Force Microscope); (4) observation for examining whether or not the crystal has an orthohombic system by a polarization microscope under crossed Nicols; (5) chemical composition analysis by ICP-AES (Inductively Coupled Plasma Atomic Emission Spectroscopy) and EPMA (Electron Probe Microanalysis); and (6) thermal analysis for examining phase transition.

In addition, in the X-ray diffraction in (1), a reference pattern of BiSTa for comparison with the X-ray diffraction patterns (XRDPS) obtained in this example was calculated by Rietveld simulation on the basis of lattice constants calculated by Rae (a=0.553065 nm, b=0.553445 nm and c=2.49839 nm) [see A. D. Rae, J. G. Thompson and R. L. Withers, Acta. Cryst., B48 (1992) 418]. In X-ray diffraction, there was used a commercially available system under a trade name of Rigaku RAD-IIIB. In the observation by the SEM in (2), there was used a commercially available SEM under a trade name of Hitachi S-800. In the observation by the AFM in (3), there was used a commercially available AFM produced by Park Scientific. In the ICP-AES in (5), there was used a commercially available system under a trade name of Simadzu ICP-8000. In the EPMA in (5), WDS (Wavelength Dispersive X-ray Spectroscopy) was performed using a system under a trade name of CAMEBAXSX-50, and EDS (Energy Dispersive X-ray Spectroscopy) was not performed because of superimposition of the spectra of strontium and tantalum to each other. In the thermal analysis in (6), there was used a system under a trade name of Shinku-Riko TGD7000.

The results are shown as follows:

(1) Results of Analysis by X-ray Diffraction

Figure 3:
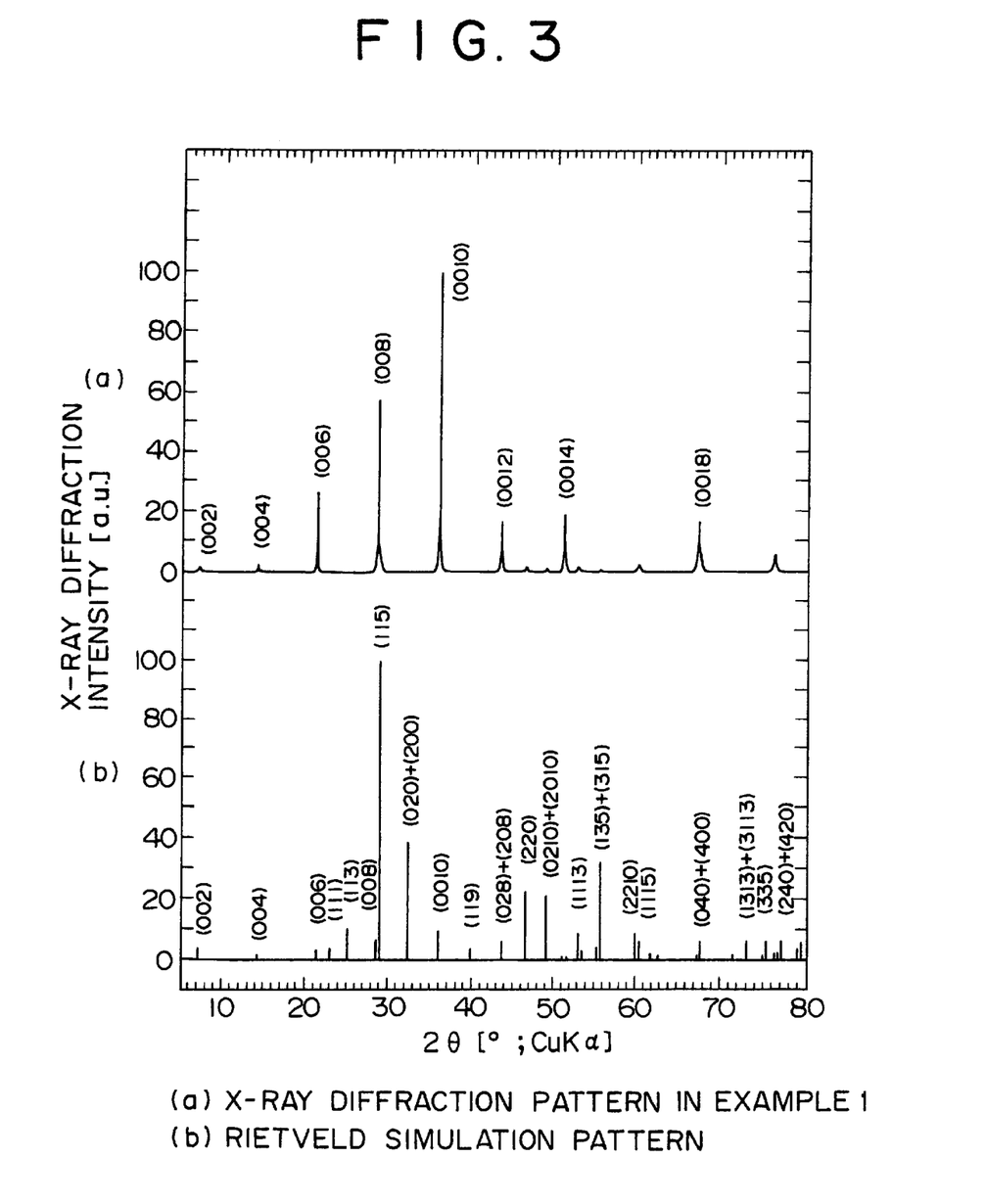
FIG. 3 is a diagram showing an X-ray diffraction pattern (a) of a single crystal obtained in Example 1 of the present invention together with a Rietveld simulation pattern (b)

FIG. 3 shows an XRDP (a) obtained in this example together with a Rietveld simulation pattern (b). In this diagram, the two patterns are in conformity with each other, which shows that the material obtained in this example is a single phase of BiSTa. Also, since the diffraction peaks at (002), (004), (006) and (0010) in the XRDP (a) are larger than those in the Rietveld simulation pattern (b), it becomes apparent that the material obtained in this example has a strong c-axis orientation due to the flake shape of the material.

Next, on the assumption that the material has a tetragonal system, the lattice constants on the a-axis and the c-axis are calculated on the basis of the diffraction peaks at (220) and (0018) of the XRDP (a). As a result, the lattice constant on the a-axis is 0.5528 nm and the lattice constant on the c-axis is 2.498 nm. Here, it is difficult to simultaneously obtain the lattice constants on the a-axis and the b-axis. The reason for this is that since the material has the c-axis orientation, a diffraction peak at (h00) and a diffraction peak at (0k0) are significantly reduced and also they are superimposed on other peaks at large diffraction angles. In this regard, Rae and others have appointed that BiSTa belongs to a space group $A2_{lam}$ [see A. D. Rae, J. G. Thompson and R. L. Withers, Acta. Cryst., B48 (1992) 418]; however, it cannot be decided that the lattice constants on the a-axis and the b-axis are identical to each other on the basis of the results of the X-diffraction performed in this example.

(2) Results of Observation of Microstructure by SEM

The observation of the surface of a flake-like material obtained in this example by the SEM shows that the surface is smooth. Such a surface may be a c-face from the results of X-ray diffraction in (1) and from the fact that BiSTa has the c-face cleavage as shown in FIG. 1.

(3) Results of Observation of Surface Morphology by AFM

The surface morphology of the flake-like material obtained in this example was observed in a scanning range of 1 mm×1 mm by the AFM. This showed that the surface was smooth; the RMS (Root Mean Square) value was about 0.4 nm; and the step on the uppermost surface had a height of 1.2 to 1.3 nm equivalent to a half of the lattice constant on the c-axis (about 2.5 nm) obtained by the results of X-ray diffraction in (1). The step is considered to be produced depending on the strong c-face cleavage or anisotropic growth. Further, the uppermost surface of each terrace may be composed of the layer 11 equivalent to $[Bi_2O_2]^{2+}$ shown in FIG. 1 because the layer 11 equivalent to $[Bi_2O_2]^{2+}$ has a strong cleavage.

Additionally, Hamazaki and others have succeeded to directly observe the 90° magnetic domain of a single crystal of $BaTiO_3$ using an AFM [see S. Hamazaki, F. Shimizu, S. Kojima and M. Takashige, J. Phys. Soc. Jpn. 64 (1995) 3660]. However, in this example, a waveniness of such a domain boundary could not be observed. This suggests the fact that any domain does not exist within the c-face.

(4) Results of Observation by Polarization Microscope Under Crossed Nicols

A single crystal obtained in this example was placed on a rotary stage between a pair of polarizers disposed in the state of crossed Nicols, and the stage was rotated with respect to the c-face to examine the presence or absence of the synchronized bright/dark states. As a result, it was revealed that any periodical brightness/darkness repetition was never observed, that is, the dark state was kept. Namely, it was revealed that the lattice constants on the a-axis and the b axis are identical to each other. This means that the single crystal exhibits a paraelectric characteristic. Accordingly, it becomes apparent that the single crystal exhibits a paraelectric characteristic in the a-axis and the b-axis (that is, within the c-face).

(5) Results of Chemical Composition Analysis by ICP-AES and EPMA

Table 1 shows the analytical results by ICP-AES and EPMA obtained in this example. As shown in Table 1, the composition of Bi, Sr and Ta is 1.92:1.10:2.00 on the basis of the results obtained by ICP-AES, and it is 1.87:1.28:2.00 on the basis of the results by EPMA. Namely, the single crystal has a composition close to the stoichiometric composition with only a small difference not shown in the X-ray diffraction pattern, and in such a composition of the single crystal, the slight deficiency of Bi from the content of Bi in the stoichiometric composition may be compensated for the increment of Sr. As a result, the single crystal may exhibit a paraelectric characteristic.

TABLE 1

| ICP-AES; | Bi:Sr:Ta = 1.92:1.10:2.00 |
|---|---|
| EPMA (WDS); | Bi:Sr:Ta = 1.87:1.28:2.00 |

(6) Results of Thermal Analysis

Figure 4:
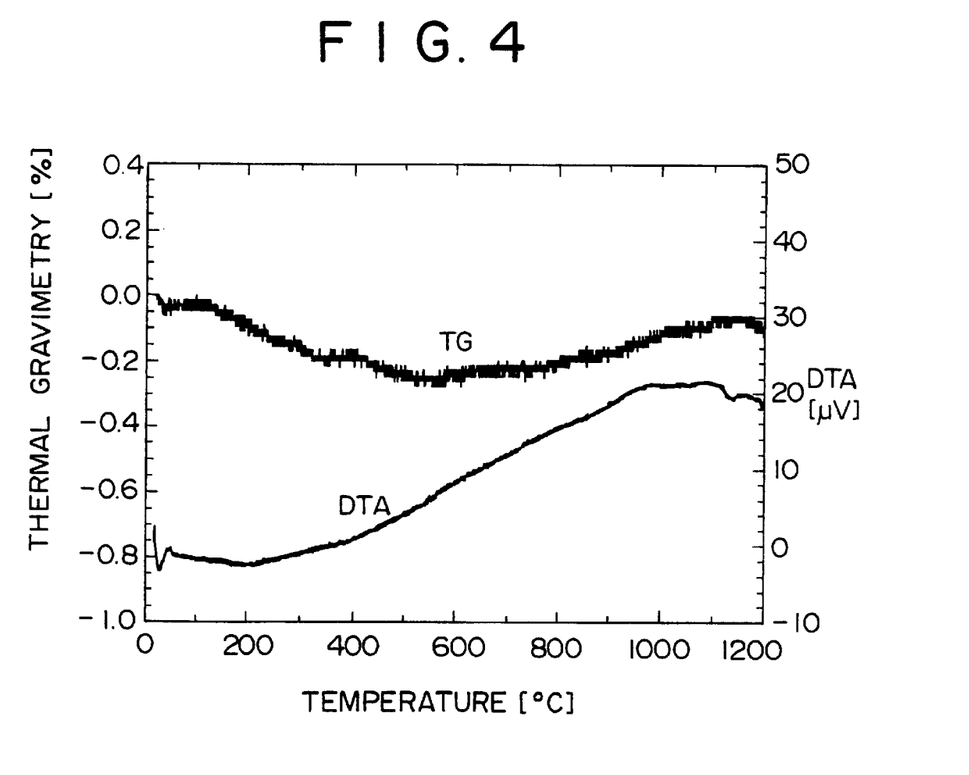
FIG. 4 is a characteristic diagram showing results of thermal analysis for a single crystal obtained in Example 1 of the present invention.

FIG. 4 shows the results of thermal analysis of a single crystal obtained in this example. As can be seen from FIG. 4, the thermal gravimetry (TG) of the single crystal is as very small as 0.3% or less in a wide temperature range. This means that once the crystal is synthesized at a high temperature of about 1400° C., there little occur evaporation of a bismuth compound and oxygen loss in a temperature range of 1200°C. or less. Also, as a result of DTA (Differential Thermal Analysis), there was not observed any thermal abnormality accompanied by ferroelectric/paraelectric phase transition produced at a temperature near 335° C. at all. Consequently, the single crystal obtained in this example is considered as a material exhibiting a paraelectric characteristic although it may be a secondary phase transition material.

From the above-described results, it becomes apparent that the single crystal obtained in this example is a layer-structured oxide containing Bi, Sr, Ta and O, and has a composition in a range out of a stoichiometric composition, in which the content of Bi is slightly deficient and the content of Sr is slightly excessive as compared with those in the stoichiometric composition, and therefore, it exhibits a paraelectric characteristic within the c-face at the composition in a specific range out of the stoichiometric composition.

EXAMPLE 2

The same raw materials as those in Example 1 were mixed at the same mixing ratio as in Example 1, and single crystals were produced from the raw materials put in the same double structure crucible 20 as in Example 1 (see FIG. 2) in the same condition as in Example 1. Thus, transparent flakes of single crystals were obtained in the platinum crucible 21. The largest flake had a size of about 4 mm×3 mm×5 μm.

The single crystal thus obtained was then subjected to (1) identification analysis by X-ray diffraction, (2) observation of a microstructure by a SEM, (3) observation of a surface morphology by an AFM, (4) observation for examining whether or not the crystal has an orthohombic system by a polarization microscope under crossed Nicols, (5) chemical composition analysis by EPMA, and (6) observation of a change of a crystal upon application of a voltage by a polarization microscope.

In the X-ray diffraction in (1), a reference pattern of BiSTa for comparison with XRDPs obtained in this example was calculated by Rietveld simulation on the basis of lattice constants calculated by Rae and others, as in Example 1. In the X-ray diffraction, there was used the commercially available system under the trade name of Rigaku RAD-IIIB. In the observation using the SEM in (2), there was used the commercially available SEM under the trade name of Hitachi S-800. In the observation using the AFM in (3), there was used the commercially available AFM sold by Park Scientific. In the EPMA in (5), WDS was performed using the system under the trade name of CAMEBAXSX-50, and EDS was not performed because of superimposition of the spectra of strontium and tantalum to each other.

Figure 5:
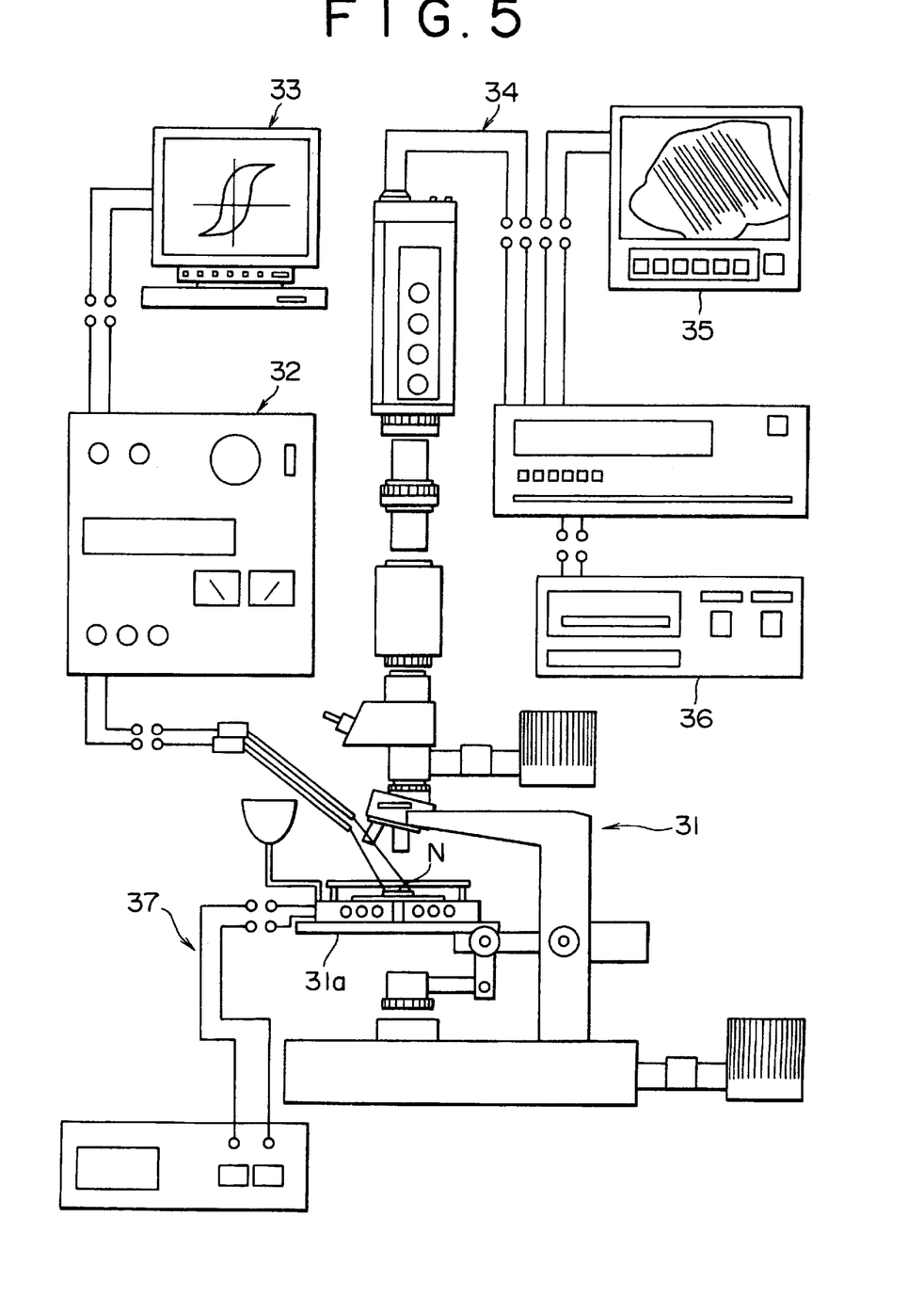
FIG. 5 is a configuration view showing a polarization microscope used for observing a change of a crystal upon application of a voltage in Example 2 of the present invention.

The observation of a change of a crystal upon application of a voltage was performed using a polarization microscope 31 shown in FIG. 5. The polarization microscope 31 is provided with a voltage applying apparatus 32 for applying a voltage to a sample N placed on a stage 31a. A computer 33 is provided on the voltage applying apparatus 32 for analyzing an electric field-polarization characteristic of the sample N. A CCD camera 34 is provided over the polarization microscope 31 for displaying, on a screen 35, an enlarged change of the crystal upon application of a voltage to the sample N and it is connected to a color video printer 36 for outputting the change of the crystal. Further, a temperature adjustment apparatus 37 is provided on the stage 31a of the polarization microscope 31 for adjusting the temperature of the sample N.

The results are shown as follows:

(1) Results of Analysis by X-ray Diffraction

Figure 6:
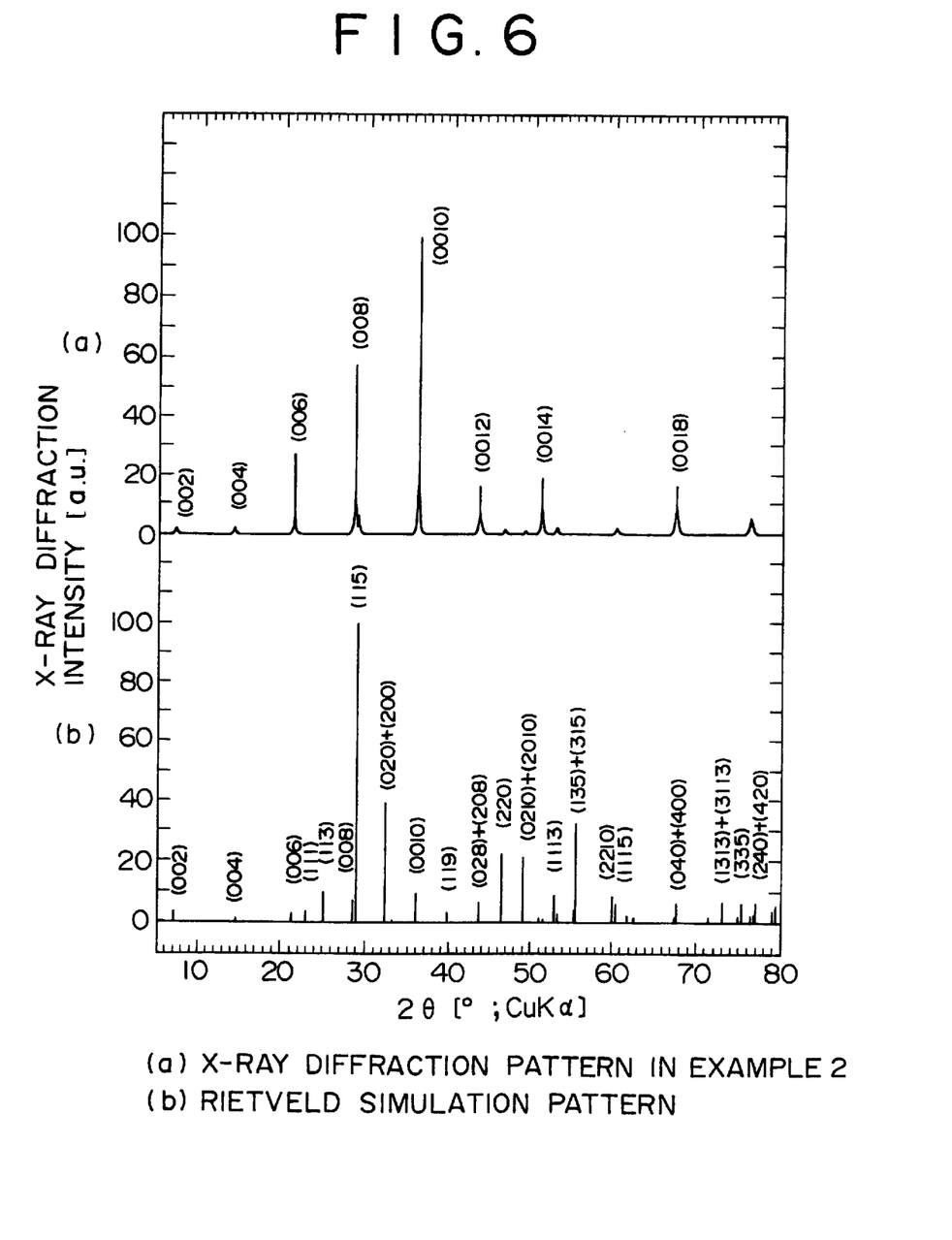
FIG. 6 is a diagram showing an X-ray diffraction pattern (a) of a single crystal obtained in Example 2 of the present invention together with a Rietveld simulation pattern (b).

FIG. 6 shows an XRDP (a) obtained in this example together with a Rietveld simulation pattern (b). In this diagram, the two patterns are in conformity with each other, which shows that the material obtained in this example is a single phase of BiSTa. Also, since the diffraction peaks at (002), (004), (006) and (0010) in the XRDP (a) are larger than those in the Rietveld simulation pattern (b), it becomes apparent that the material obtained in this example has a strong c-axis orientation due to the flake shape of the material.

Next, on the assumption that the material has a tetragonal system, the lattice constants on the a-axis and the c-axis are calculated on the basis of the diffraction peaks at (220) and (0018) of the XRDP (a). As a result, the lattice constant on the a-axis is 0.5528 nm and the lattice constant on the c-axis is 2.498 nm. In addition, as described in Example 1, it is difficult to simultaneously obtain the lattice constants on the a-axis and the b-axis, and it cannot be decided that the lattice constants on the a-axis and the b-axis are identical to each other on the basis of the results of the X-diffraction performed in this example.

(2) Results of Observation of Microstructure by SEM

The observation of the surface of a flake-like material obtained in this example by the SEM shows that the surface is smooth. Such a surface may be a c-face from the results of X-ray diffraction in (1) and from the fact that BiSTa has the c-face cleavage as shown in FIG. 1.

(3) Results of Observation of Surface Morphology by AFM

The surface morphology of the flake-like material obtained in this example was observed in a scanning range of 1 mm×1 mm by the AFM. This showed that the surface was smooth; the RMS value was about 0.4 nm; and the step on the uppermost surface had a height of 1.2 to 1.3 nm equivalent to a half of the lattice constant on the c-axis (about 2.5 nm) obtained by the results of X-ray diffraction in (1). The step is considered to be produced depending on the strong c-face cleavage or anisotropic growth. Further, the uppermost surface of each terrace may be composed of the layer 11 equivalent to $[Bi_2O_2]^{2+}$ shown in FIG. 1 because the layer 11 equivalent to $[Bi_2O_2]^{2+}$ has a strong cleavage. (4) Results of observation by polarization microscope under crossed Nicols.

A single crystal obtained in this example was placed on a rotary stage between a pair of polarizers disposed in the state of crossed Nicols, and the stage was rotated with respect to the c-face to examine the presence or absence of the synchronized bright/dark states. As a result, it was revealed that a periodical brightness/darkness repetition was observed. Namely, it was revealed that the lattice constants of the single crystal on the a-axis and the b axis are not identical to each other.

(5) Results of Chemical Composition Analysis by EPMA

As the results of chemical composition analysis by EPMA (WDS), the composition of Bi, Sr and Ta is 1.92:1.29: 2.00. Namely, the single crystal has a composition close to the stoichiometric composition with only a small difference not shown in the X-ray diffraction pattern, and in such a composition of the single crystal, the slight deficiency of Bi from the content of Bi in the stoichiometric composition may be compensated for the increment of Sr.

(6) Observation of Change of Crystal Upon Application of Voltage

Gold (Au) was vapor-deposited on the surface of the single crystal obtained in this example at intervals of 500 µm, to form an electrode. The electrode was applied with a voltage of 120 V by the polarization microscope shown in FIG. 5, with a result that there was observed a change exhibiting the reversal of domains. That is, it becomes apparent that the single crystal exhibits a ferroelectric characteristic.

From the above-described results, it becomes apparent that the single crystal obtained in this example is a layer-structured oxide containing Bi, Sr, Ta and O, and has a composition in a range out of a stoichiometric composition, in which the content of Bi is slightly deficient and the content of Sr is slightly excessive as compared with those in the stoichiometric composition, and that the lattice constants of the single crystal on the a-axis and the b-axis are not identical to each other. As a result, the single crystal in this example exhibits a ferroelectric characteristic within the c-face. It is considered that the lattice constants on the a-axis and the b-axis and the electric field-polarization characteristic are influenced by the fact that the content of bismuth is slightly deficient and the content of strontium is slightly excessive, and that the single crystal thus exhibits a desirable remanent polarization.

While the present invention has been described with reference to the embodiment using the specific examples, such description is for illustrative purposes only, and it is to be understood that many changes may be made without departing from the scope of the present invention. For example, in the examples, description has been made of the case of producing a layer-structured oxide containing bismuth, strontium, tantalum, and oxygen; however, the present invention can be similarly applied to a case of producing a layer-structured oxide containing bismuth, a first component, a second component, and oxygen where the first component is composed of at least one kind selected from a group consisting of strontium, lead, barium, and calcium and the second component is composed of at least one kind selected from a group consisting of niobium and tantalum.

What is claimed is:

1. A layer-structured oxide containing bismuth (Bi), strontium (Sr), tantalum (Ta), and oxygen (O) said oxide being paraelectric, wherein a composition formula of said oxide is expressed by $Bi_{1.92}Sr_{1.10}Ta_{2.00}O_9$.

2. A layer-structured oxide containing bismuth (Bi), strontium (Sr), tantalum (Ta), and oxygen (O), said oxide being paraelectric, wherein a composition formula of said oxide is expressed by $Bi_{2-a}Sr_{1+b}Ta_2O_{9+}C$ where a, b, and c are values in ranges of $0<a\leq0.2$, $0<b\leq0.3$, and $-0.3\leq c\leq0.3$.

3. A process of producing a paraelectric, layer-structured oxide having a composition formula expressed by $Bi_{1.92}Sr_{1.10}Ta_{2.00}O_9$, said process comprising the step of producing said oxide by a self-flux method using bismuth oxide as a flux.

4. A process according to claim 1, wherein said self-flux method includes the steps of sealing starting material containing strontium oxide and tantalum oxide with the bismuth oxide in a crucible, heating the starting material up to 1400° C. and then cooling to form the layered structure.

5. A process of producing a paraelectric, layer-structured oxide having a composition formula expressed by $Bi_{2-a}Sr_{1+b}Ta_2O_{9+C}$ where a, b, and c are values in ranges of $0<a\leq0.2$, $0<b\leq0.3$, and $-0.3\leq c\leq0.3$, said process comprising the step of producing said oxide by a self-flux method using bismuth oxide as a flux.

6. A process according to claim 1, wherein said self-flux method includes sealing the bismuth oxide in a crucible with strontium oxide and tantalum oxide, heating to 140020 C. and then cooling to form the layered structure.

* * * * *